May 30, 1967 R. M. HAYES 3,323,070
VARIABLE GAIN AMPLIFIER HAVING CONSTANT FREQUENCY BAND PASS
Filed May 12, 1964
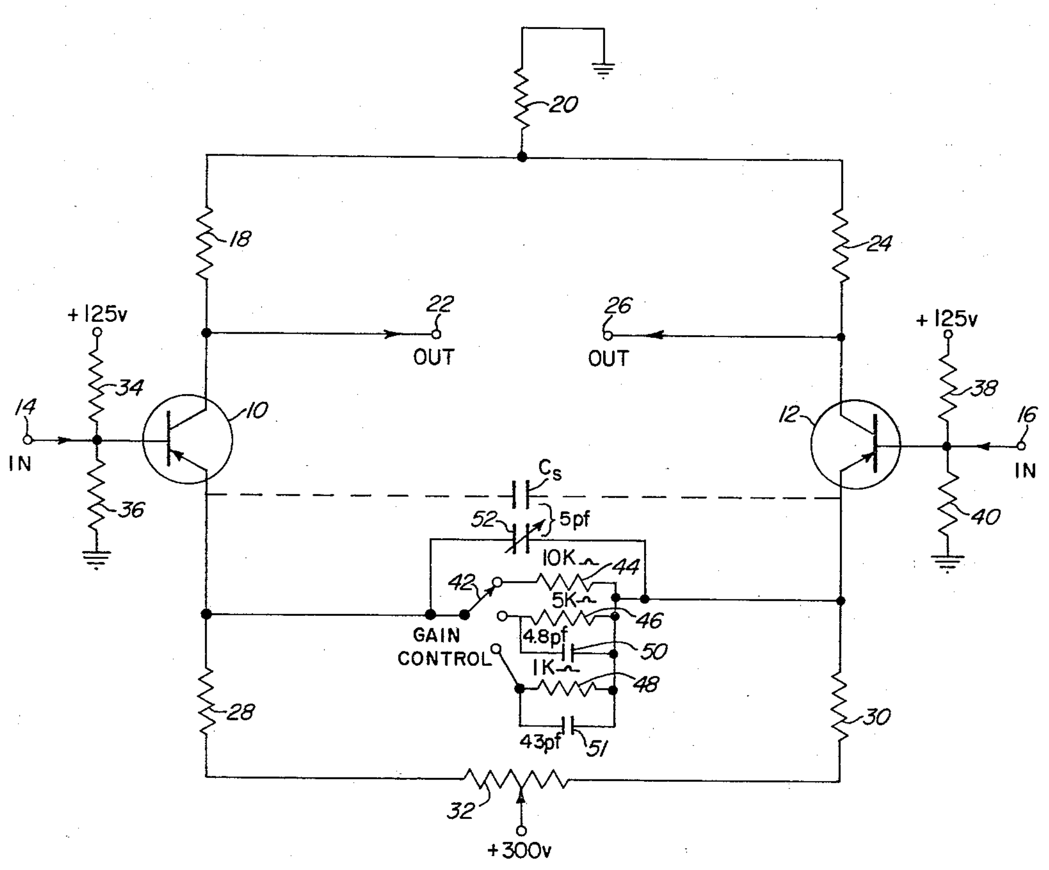
ROY M. HAYES
INVENTOR.
BY
BUCKHORN, BLORE, KLARQUIST & SPARKMAN
ATTORNEYS United States Patent Office 3,323,070
Patented May 30, 1967

3,323,070

VARIABLE GAIN AMPLIFIER HAVING CONSTANT FREQUENCY BAND PASS

Roy M. Hayes, Portland, Oreg., assignor to Tektronix, Inc., Beaverton, Oreg., a corporation of Oregon Filed May 12, 1964, Ser. No. 366,705
6 Claims. (Cl. 330—15)

The subject matter of the present invention relates generally to electrical signal amplifier circuits, and in particular to an amplifier circuit whose frequency band pass remains substantially constant when its gain is varied by changing the value of negative current feedback resistance for the amplifier while maintaining the RC time constant of its total degenerative impedance and the stray capacitance in parallel therewith substantially the same. This is accomplished by connecting additional capacitors in parallel with the different feedback resistors and increasing the values of such capacitors as the value of such resistors decreases. As a result, increases in gain by reduction of the feedback resistance which previously changed the high frequency response of conventional amplifiers, do not affect the frequency response of the present amplifier circuit.

The amplifier circuit of the present invention is especially useful when employed as a push-pull amplifier in the vertical deflection system of a cathode ray oscilloscope. However the present amplifier may also be of the single ended type.

Amplifier circuits often employ large resistors connected to the emitters of transistors or the cathodes of vacuum tubes as negative current feedback elements in order to provide the amplifier with greater stability. In order to increase the gain of such an amplifier, the negative feedback or degeneration resistance may be decreased, but this results in a corresponding decrease in stability. In conventional amplifiers this increase in gain also changes the frequency band pass of the amplifier, because the high frequency response of such amplifier is dependent upon the RC time constant of the negative feedback impedance and the stray capacitance of the signal translating device in parallel with such impedance. Since the stray capacitance remains relatively constant, a decrease in value of the feedback resistance reduces this RC time constant which decreases the high frequency response of conventional amplifiers.

Previous amplifier circuits, such as that described in U.S. Patent 2,802,069 by Weber, have employed inductances as part of a complicated frequency compensation circuit in order to produce a correction current in the negative feedback resistor which compensates for that portion of the degeneration current shunted around such resistor at high frequencies through the stray capacitance in parallel with such resistor. In addition to being expensive and unreliable, these compensation circuits have not been entirely satisfactory because the correction current is out of phase with the degeneration current due to the phase shift caused by the inductance. The amplifier circuit of the present invention has several advantages over previous amplifier circuits in that it provides a substantially constant frequency band pass over a wider range of different gain settings of such amplifier. In addition, the present amplifier circuit is of simple and inexpensive construction and operates in an accurate and trouble-free manner.

Therefore, it is one object of the present invention to provide an improved amplifier circuit having substantially constant frequency band pass for different gain settings of such amplifier.

Another object of the invention is to provide an improved amplifier circuit of simple and inexpensive construction which has a substantially constant high frequency response.

A further object of the present invention is to provide an improved amplifier circuit in which a plurality of negative current feedback resistances are selectively connected to an electrical signal translating device in order to vary the gain of the amplifier, and a plurality of compensating capacitors are employed to maintain the RC time constant of the feedback impedance including the selected resistance and the stray capacitance of such signal translating device substantially the same for all gain settings in order to prevent the high frequency response of such amplifier from varying with gain.

An additional object of the present invention is to provide an improved amplifier circuit which operates in a simple, reliable and accurate manner which requires less calibration.

Other objects and advantages of the present invention will be apparent from the following detailed description of a preferred embodiment thereof and from the attached drawings of which:

The figure is a schematic diagram of one embodiment of an amplifier made in accordance with the present invention.

The preferred embodiment of the invention is a push-pull amplifier including a pair of signal translating devices 10 and 12, which may be transistors of the PNP type. The base of transistor 10 is connected to an input terminal 14 while the base of transistor 12 is connected to an input terminal 16. The collector of transistor 10 is connected through a first load resistor 18 of 12.4 kilohms to ground through a common load resistor 20 of 12.4 kilohms and is connected to a first output terminal 22 across such load resistors. In a similar manner the collector of transistor 12 is connected through a second load resistor 24 of 12.4 kilohms to ground through the common load resistor 20, and to a second output terminal 26 across such load resistors. The emitters of transistors 10 and 12 are connected through bias resistors 28 and 30, respectively, of 100 kilohms to the opposite end terminals of a potentiometer 32 of 1.0 kilohm whose movable contact is connected to a source of positive D.C. supply voltage of +300 volts. The movable contact on potentiometer 32 is adjusted in order to balance the D.C. voltage level of output terminals 22 and 26.

A first voltage divider including a resistor 34 of 12 kilohms in series with a bias resistor 36 of 47 kilohms is connected between a positive D.C. voltage source of +125 volts and ground so that the voltage drop across bias resistor 36 is applied to the base of transistor 10 to forwardly bias the emitter junction of such transistor and render it normally conducting. In a similar manner a second voltage divider formed by a resistor 38 of 12 kilohms in series with a bias resistor 40 of 47 kilohms is connected between a positive D.C. voltage source of +125 volts and ground and the common connection of such resistors is connected to the base of transistor 12 to forward bias the emitter junction of such transistor and render it normally conducting. The emitters of transistors 10 and 12 are connected together to form a push-pull amplifier through a gain control switch 42 whose movable contact may be rotated to select different common emitter coupling impedances in order to vary the amount of the negative feedback current signal coupled between the emitters of such transistors to vary the gain of the push-pull amplifier. In the position of the gain control switch 42 shown, a negative feedback resistor 44 of 10 kilohms is connected between the emitters of transistors 10 and 12 to provide a first gain setting for the amplifier. When the movable contact of switch 42 is rotated clockwise to the second switch position, a feedback resistor 46 of 5 kilohms is then connected between the emitters of transistors 10 and 12 in order to reduce the amount of degenerative feedback and to increase the gain of the amplifier. In the third clockwise position of the switch a feedback resistor 48 of 1 kilohm is connected between the emitters of such transistors to increase the gain of the push-pull amplifier over that of the second setting.

Since there is a certain amount of stray capacitance $C_s$ produced between the emitters of transistors 10 and 12, the RC time constant of the common emitter coupling impedance formed by such stray capacitance with the selected feedback resistor and bias resistors 28, 30 and 32 would normally vary with different settings of the switch 42 due to the different resistances of the feedback resistors. As a result, the upper limit frequency at which the input signals transmitted to the emitters of transistors 10 and 12 are shunted around the feedback resistors by the stray capacitance $C_s$ tends to vary with different settings of the gain control switch 42. Thus, when the movable contact at switch 42 is rotated to either feedback resistor 46 or feedback resistor 48 to increase the gain, the common emitter coupling resistance is less than it is in the switch position shown, so that the impedance of the stray capacitance must be less in order to effectively short circuit such feedback impedance at high frequencies. As a result, the high frequency response of the amplifier tends to decrease with decreases in resistance of the negative feedback resistor.

In order to maintain the frequency band pass of the amplifier the same for different gain settings, the RC time constants of the common emitter coupling impedance in the second and third positions of the gain control switch 42 are made equal to that of such impedance in the first switch position shown. This is accomplished by adding a compensation capacitor 50 in parallel with feedback resistor 46, and by adding a compensation capacitor 51 in parallel with feedback resistor 48. A variable shunt capacitor 52 may be connected between the emitters of transistors 10 and 12 in parallel with the stray capacitance $C_s$ in all positions of the selector switch 42 in order to standardize the total shunt capacitance regardless of the variations in stray capacitance between similar amplifier circuits. The value of compensation capacitor 50 is 4.8 picofarads so that the multiplication product of the equivalent resistance of feedback resistor 46 and bias resistors 28, 30 and 32 and the equivalent capacitance of the stray capacitor, the compensation capacitor and the variable shunt capacitor is equal to the multiplication product of the equivalent resistance $R_T$ of the feedback resistor 44 and bias resistors 28, 30 and 32 and the equivalent capacitance of $C_T$ of stray capacitor and shunt capacitor 52. The variable capacitor 52 may be adjusted so that the total shunt capacitance $C_T$ of the stray capacitance and variable capacitor is 5 picofarads (pf). Since $$R_T=\frac{(100K+100K+1K)10K}{100K+100K+1K+10K}=\frac{201K\times 10K}{211K}=9.53K$$

and $C_T=5$ pf., the RC time constant is approximately 47.65. Therefore, the value $C_1$ of the capacitor 50 is given by the formulae $R_{T1}C_{T1}=47.65$ where $$R_{T2}=\frac{201K\times 5K}{206K}=4.88K$$

and $C_1=C_{T1}-5$ pf. Thus $$C_1=\frac{47.65}{4.88}-5\text{ pf.}=9.8-5=4.8\text{ pf.}$$

In a similar manner the value $C_2$ of compensation capacitor 51 may be determined to be 43 picofarads by the formulae $$R_{T2}C_{T2}=47.65\text{ when }R_{T2}=\frac{201K\times 1K}{202K}=.995$$

and $C_2=C_{T2}-5$ pf., or $$C_2=\frac{47.65}{.995}-5\text{ pf.}=48-5=43\text{ pf.}$$

For maximum frequency band width the RC time constant of the common emitter coupling impedance should equal the RC time constant of the load resistors 18 and 24 and the stray collector capacitance (not shown) produced between the collectors of transistors 10 and 12. As has already been mentioned, the high frequency compensation means of the present invention may also be provided on a single ended amplifier. Also a vacuum tube amplifier can be employed rather than a transistor amplifier in which case the transistors 10 and 12 would be replaced by triode vacuum tubes having their cathodes connected together through the gang control switch 42, and different values of resistance and capacitance employed.

It will be obvious to those having ordinary skill in the art that various changes may be made in the details of the above described embodiment of the present invention without departing from the spirit of the invention. Therefore, the scope of the present invention should only be determined by the following claims.

I claim:

1. An amplifier circuit having substantially constant frequency band pass with variable gain, comprising:
   - a signal translating device having an input terminal, an output terminal and a common terminal;
   - a plurality of different feedback impedances each including a feedback resistance and a capacitance connected in shunt across said resistance, with the feedback resistances and capacitances of said impedances being of different predetermined values to vary the gain of said amplifier circuit while maintaining frequency bandwidth substantially constant; and
   - switch means for selectively connecting said impedances to the common terminal of said device so that the selected impedance provides negative current feedback, to vary the gain of said amplifier, said device having a stray capacitance in parallel with the selected impedance, and the capacitances of said impedances being of different predetermined values to compensate for the different feedback resistances so that the RC time constant of the selected impedance and said stray capacitance is substantially the same for each of said impedances.

2. An amplifier circuit having substantially constant frequency band pass with variable gain, comprising:
   - a signal translating device having emitting, collecting and control electrodes;
   - means for applying input signals to said control electrode;
   - means for transmitting output signals from said collector electrode;
   - a plurality of different feedback impedances each including a feedback resistance and a capacitance connected in shunt across said feedback resistance, with the feedback resistances and capacitances of said impedances being of different predetermined values to vary the gain of said amplifier circuit while maintaining frequency bandwidth substantially constant; and
   - switch means for selectively connecting one of said impedances to said emitting electrode so that the selected impedance provides negative current feedback, to vary the gain of said amplifier by changing the position of said switch means, said signal translating device having a stray capacitance in parallel with the selected impedance, and the capacitances of said impedances being of different predetermined values to compensate for the different feedback resistances so that the RC time constant of the selected impedance and said stray capacitance is substantially the same for each of said impedances.

3. An amplifier circuit having substantially constant frequency band pass with variable gain, comprising:
   - a transistor having emitter, collector and base electrodes;

means connecting said transistor as a common emitter amplifier;

a plurality of different feedback impedances, at least some of said impedances including a feedback resistance and a capacitance connected in shunt across said resistance with the feedback resistances and capacitances of said impedances being of different predetermined values to vary the gain of said amplifier circuit while maintaining frequency bandwidth substantially constant; and manual switch means for selectively connecting said impedances to the emitter of said transistor so that the selected impedance provides negative current feedback, to vary the gain of said amplifier by changing the selected impedance, and said transistor having a stray capacitance in parallel with the selected impedance, and the capacitances of said impedances being of different predetermined values to compensate for the different feedback resistances so that the RC time constant of the selected impedance and said stray capacitance is substantially the same for each of said impedances.

4. A push-pull amplifier, comprising:

a pair of signal translating devices each having emitting, collecting and control electrodes;

a pair of input terminals connected to the control electrodes of said devices;

a pair of output terminals connected to the collecting electrodes of said devices;

said devices having an equivalent stray capacitance produced between the emitter electrodes of said devices;

a pair of bias resistances respectively connected to different ones of the emitting electrodes of said devices;

a plurality of different coupling impedances each including a feedback resistance and a compensation capacitance connected in shunt across said feedback resistance with the feedback resistances and capacitances of said impedances being of different predetermined values to vary the gain of said amplifier circuit while maintaining frequency bandwidth substantially constant; and switch means for selectively connecting said coupling impedances between the emitting electrodes of said devices so that the selected coupling impedance provides negative current feedback, to vary the gain of said amplifier by changing the position of said switch means, said coupling impedances having compensation capacitances of different predetermined values so that the RC time constant of the selected coupling impedance, said bias resistances and stray capacitance is substantially the same for each of said coupling impedances.

5. A push-pull amplifier, comprising:

a pair of transistors each having emitter, collector and base electrodes;

a pair of input terminals connected to the bases of said transistors;

a pair of output terminals connected to the collectors of said transistors;

said transistors having an equivalent stray capacitance produced between the emitters of said transistors;

a pair of load resistances respectively connected to different ones of the collectors of said transistors;

a pair of bias resistances respectively connected to different ones of the emitters of said transistors;

means for applying D.C. supply voltage across said load resistances and said bias resistances;

a plurality of different D.C. coupling impedances each including a feedback resistance and a compensation capacitance connected in shunt across said feedback resistance, with the feedback resistances and capacitances of said impedances being of different predetermined values to vary the gain of said amplifier circuit while maintaining frequency bandwidth substantially constant; and switch means for selectively connecting said coupling impedances between the emitters of said transistors so that the selected coupling impedance provides negative current feedback, to vary the gain of said amplifier by changing the position of said switch means, said coupling impedances having compensation capacitances of different predetermined values so that the RC time constant of the selected coupling impedance, said bias resistances and said stray capacitance is substantially the same for each of said coupling impedances.

6. A push-pull amplifier, comprising:

a pair of transistors each having emitter, collector and base electrodes;

a pair of input terminals connected to the bases of said transistors;

a pair of output terminals connected to the collectors of said transistors;

said transistors having an equivalent stray capacitance produced between the emitters of said transistors;

a pair of load resistances respectively connected to different ones of the collectors of said transistors;

a pair of bias resistances respectively connected to different ones of the emitters of said transistors;

means for applying D.C. supply voltage across said load resistances and said bias resistances;

a plurality of different coupling impedances each including a feedback resistance and a compensation capacitance connected across said feedback resistance, with the feedback resistances of said impedances being of different predetermined values;

a variable capacitance connected between the emitters of said transistors in parallel with the stray capacitance in order to set the value of the total shunt capacitance between said emitters to a standard value; and switch means for selectively connecting said coupling impedances between the emitters of said transistors so that the selected coupling impedance provides negative current feedback, to vary the gain of said amplifier by changing the position of said switch means; said coupling impedances having compensation capacitances of different predetermined values so that the RC time constant of the selected coupling impedance, said bias resistances and said shunt capacitance is substantially the same for each of said coupling impedances.

References Cited

UNITED STATES PATENTS

| | | | |
|---|---|---|---|
| 2,933,694 | 4/1960 | Carter. | |
| 2,955,259 | 10/1960 | Lax | 330—29 X |
| 3,153,203 | 10/1964 | Sem-Jacobsen et al. | 330—28 X |
| 3,200,345 | 8/1965 | Luckenbach et al. | 330—30 X |

FOREIGN PATENTS

| | | |
|---|---|---|
| 529,044 | 11/1940 | Great Britain. |

ROY LAKE, *Primary Examiner.*

F. D. PARIS, E. C. FOLSOM, *Assistant Examiners.*